(12) United States Patent
Liu et al.

(10) Patent No.: US 9,398,714 B1
(45) Date of Patent: Jul. 19, 2016

(54) METHOD OF ATTACHING ELECTRONIC MODULE ON FABRICS BY STITCHING METAL FOIL

(71) Applicant: Flextronics AP, LLC, Broomfield, CO (US)

(72) Inventors: Weifeng Liu, Dublin, CA (US); Zhen Feng, San Jose, CA (US); Anwar Mohammed, San Jose, CA (US)

(73) Assignee: Flextronics AP, LLC, Broomfield, CO (US)

( * ) Notice: Subject to any disclaimer, the term of this patent is extended or adjusted under 35 U.S.C. 154(b) by 0 days.

(21) Appl. No.: 14/229,671

(22) Filed: Mar. 28, 2014

Related U.S. Application Data

(60) Provisional application No. 61/913,830, filed on Dec. 9, 2013.

(51) Int. Cl.
| | | |
|---|---|---|
| *H05K 1/11* | (2006.01) | |
| *H05K 1/18* | (2006.01) | |
| *H05K 7/02* | (2006.01) | |
| *H05K 13/04* | (2006.01) | |
| *H05K 3/40* | (2006.01) | |
| *H05K 3/42* | (2006.01) | |

(52) U.S. Cl.
CPC .............. *H05K 7/02* (2013.01); *H05K 1/111* (2013.01); *H05K 1/18* (2013.01); *H05K 1/181* (2013.01); *H05K 13/04* (2013.01); *H05K 1/112* (2013.01); *H05K 1/115* (2013.01); *H05K 3/4015* (2013.01); *H05K 3/42* (2013.01); *H05K 2201/0287* (2013.01)

(58) Field of Classification Search
CPC ........... H05K 7/02; H05K 3/10; H05K 1/111; H05K 1/112; H05K 1/115; H05K 1/117; H05K 1/023; H05K 1/11; H05K 1/16; H05K 1/18; H05K 1/181; H05K 3/30; H05K 3/405; H05K 3/42; H05K 2201/09545; H05K 2201/09981; H05K 2201/0287; H01L 23/14
USPC .................. 174/250–268; 361/760, 792–795; 29/832, 852
See application file for complete search history.

(56) References Cited

U.S. PATENT DOCUMENTS

| | | |
|---|---|---|
| 7,019,973 B2 | 3/2006 | Rivera |
| 7,573,727 B2 | 8/2009 | Hauenstein |
| 8,258,011 B2 | 9/2012 | Brun |
| 8,469,741 B2 | 6/2013 | Oster |
| 8,861,220 B2 | 10/2014 | Loher |
| 2002/0076948 A1* | 6/2002 | Farrell ................. B32B 5/02 438/800 |
| 2002/0094701 A1 | 7/2002 | Bigelsen |
| 2003/0127246 A1 | 7/2003 | Watanabe |
| 2004/0229533 A1 | 11/2004 | Braekevelt |

(Continued)

*Primary Examiner* — Ishwarbhai B Patel
(74) *Attorney, Agent, or Firm* — Haverstock & Owens LLP

(57) ABSTRACT

A wearable electronics assembly includes one or more electronic modules coupled to a wearable electronics fabric. Each of the one or more electronic modules includes one or more metal foils, each metal foil electrically coupled at one end to an electrical connection point of the electrical module and at another end to an electrically conductive wire. The electrically conductive wire is stitched to the metal foil and to a fabric onto which the electronic module is attached. The electronic module can include one or more electronic components coupled to a printed circuit board. The metal foils can be formed from interconnects on the printed circuit board or the metal foils can be separate elements coupled to the printed circuit board.

15 Claims, 2 Drawing Sheets

(56) References Cited

U.S. PATENT DOCUMENTS

| | | |
|---|---|---|
| 2005/0280157 A1 | 12/2005 | Roush |
| 2007/0054511 A1 | 3/2007 | Ittel |
| 2007/0290305 A1 | 12/2007 | Oyama |
| 2008/0258314 A1* | 10/2008 | Yoo .......................... H01L 23/14 257/784 |
| 2009/0317639 A1 | 12/2009 | Axisa |
| 2010/0276497 A1* | 11/2010 | Seban .................. G06K 19/027 235/492 |
| 2011/0119812 A1* | 5/2011 | Genz ....................... F21V 23/04 2/244 |
| 2012/0314382 A1 | 12/2012 | Wesselmann |
| 2014/0124257 A1 | 5/2014 | Yoshihara et al. |
| 2014/0299362 A1 | 10/2014 | Park |

* cited by examiner

METHOD OF ATTACHING ELECTRONIC MODULE ON FABRICS BY STITCHING METAL FOIL

RELATED APPLICATIONS

This Patent Application claims priority under 35 U.S.C. 119 (e) of the U.S. Provisional Application, Ser. No. 61/913,830, filed Dec. 9, 2013, and entitled "METAL FABRIC STITCHING AND STRETCHABLE BATTERIES". This application incorporates U.S. Provisional Application, Ser. No. 61/913,830 in its entirety by reference.

FIELD OF THE INVENTION

The present invention is generally directed to the field of wearable electronics. More specifically, the present invention is directed to wearable electronics fabric having an electronic module with electrical connectivity provided by stitched electrically conductive wire.

BACKGROUND OF THE INVENTION

Electronic devices are increasingly being developed so as to be worn by a user, such as in wearable electronics. Metal wires are commonly used as electrical conductors between electronic devices. As applied to wearable electronics, providing electrical connectivity to or between one or more worn electrical devices is typically done using a separate electrical cable that includes a metal wire. However, having loose cables is often a nuisance and ungainly.

SUMMARY OF THE INVENTION

Embodiments of a wearable electronics assembly are directed to one or more electronic modules coupled to a wearable electronics fabric. Each of the one or more electronic modules includes one or more metal foils, each metal foil electrically coupled at one end to an electrical connection point of the electrical module and at another end to an electrically conductive wire. The electrically conductive wire is stitched to the metal foil and to a fabric onto which the electronic module is attached. The electronic module can include one or more electronic components coupled to a printed circuit board. The metal foils can be formed from interconnects on the printed circuit board or the metal foils can be separate elements coupled to the printed circuit board. In some embodiments, the fabric is a wearable electronics fabric having one or more insulated wires woven into the fabric. In some embodiments, the insulated wire includes an inner metal wire and an outer insulation layer. The electrically conductive wire stitched to the metal foil can also be electrically coupled to the metal wire within the insulated wire of the fabric. In some embodiments, the wearable electronics fabric is clothing, such as a shirt or pants, or other form to be worn by a user, such as an armband, waistband, hat or shoes.

In an aspect, an electronics assembly is disclosed that includes a fabric, an electronics module, a metal foil and an electrically conductive wire. The electronics module is coupled to the fabric, and the electronics module includes an electrical connection point. The metal foil includes a first portion and a second portion, where the first portion is coupled to the electrical connection point and the second portion extends beyond a physical footprint of the electronics module. The electrically conductive wire is stitched to the fabric and to the second portion of the metal foil such that an electrical connection is formed between the electrically conductive wire and the electrical connection point via the metal foil. In some embodiments, the electrically conductive wire is stitched through the second portion of the metal foil and through the fabric. In other embodiments, the electrically conductive wire is stitched through the fabric and over the second portion of the metal foil thereby lashing the second portion of the metal foil to the fabric. In some embodiments, the metal foil is a strip having a first end and a second end, wherein the first portion includes the first end and the second portion includes the second end. The electronics assembly can also include an encapsulation layer coupled to the electronics module, the metal foil and the electrically conductive wire. In some embodiments, the electronics module includes a printed circuit board and one or more electronic components coupled to the printed circuit board, where the printed circuit board includes the electrical connection point. In some embodiments, the printed circuit board also includes one or more electrically conductive interconnects. In some embodiments, the metal foil is one of the one or more interconnects such that the first portion of the metal foil is integrated with a substrate of the printed circuit board and the second portion of the metal foil is free of the substrate. In some embodiments, the printed circuit board is a single layer printed circuit board. In other embodiments, the printed circuit board is a multiple layer printed circuit board. In the case of a multiple layer printed circuit board the metal foil can be coupled to a top layer, a bottom layer, or an interior layer of the printed circuit board. In some embodiments, the fabric includes an insulated wire including an inner metal wire and an outer insulation layer, and the electrically conductive wire is electrically coupled to the inner metal wire of the insulated wire. In some embodiments, the electrically conductive wire stitched to the fabric includes two separate wires, wherein the two separate wires are a metal wire and an insulation wire. In some embodiments, the electronics assembly is wearable.

In another aspect, a method of making an electronics assembly is disclosed. The method includes fabricating an electronics module, wherein the electronics module includes an electrical connection point, and forming a metal foil coupled to the electrical connection point, wherein the metal foil includes a first portion and a second portion. The first portion is coupled to the electrical connection point and the second portion extends beyond a physical footprint of the electronics module. The method also includes attaching the electronics module to a fabric, and stitching an electrically conductive wire to the fabric and to the second portion of the metal foil such that an electrical connection is formed between the electrically conductive wire and the electrical connection point via the metal foil. In some embodiments, the electrically conductive wire is stitched through the second portion of the metal foil and through the fabric. In other embodiments, the electrically conductive wire is stitched through the fabric and over the second portion of the metal foil thereby lashing the second portion of the metal foil to the fabric. In some embodiments, forming the metal foil coupled to the electrical connection point includes forming a metal strip having a first end and a second end, where the first portion includes the first end and the second portion includes the second end, and coupling the first end to the electrical connection point. The method can also include adding an encapsulation layer coupled to the electronics module, the metal foil and the electrically conductive wire. In some embodiments, the electronics module includes a printed circuit board and one or more electronic components coupled to the printed circuit board, wherein the printed circuit board includes the electrical connection point. In some embodiments, the printed circuit board also includes one or more electrically conductive interconnects. In some embodiments, the metal foil is made of one of the one or more interconnects, and forming the metal foil coupled to the electrical connection point includes removing a portion of a substrate of the printed circuit board such that the second portion of the metal foil is free of the substrate and the first portion of the metal foil remains integrated with the substrate. In some embodiments, removing the portion of the substrate includes ablating the portion of the substrate to expose the second portion of the metal foil. In some embodiments, the fabric includes an insulated wire including an inner metal wire and an outer insulation layer, and the method also includes electrically coupling the electrically conductive wire to the inner metal wire of the insulated wire. In some embodiments, the electrically conductive wire stitched to the fabric includes two separate wires, wherein the two separate wires are a metal wire and an insulation wire, and stitching the electrically conductive wire to the fabric and to the second portion of the metal foil includes stitching the two separate wires.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the present application are directed to an electronics module coupled to a fabric and methods of attaching the electronics module to the fabric. Those of ordinary skill in the art will realize that the following detailed description of the products and methods are illustrative only and is not intended to be in any way limiting. Other embodiments of the products and methods will readily suggest themselves to such skilled persons having the benefit of this disclosure.

Reference will now be made in detail to implementations of the products and methods as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
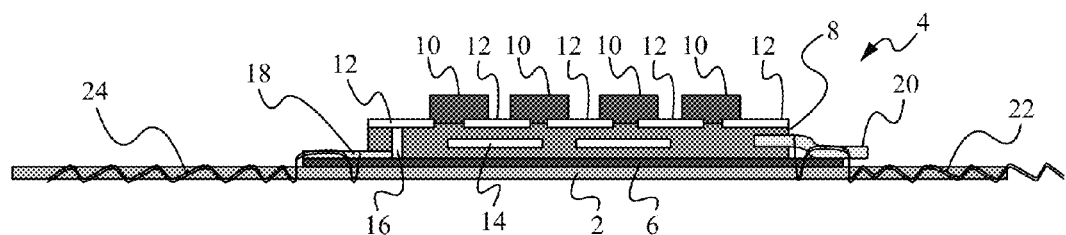
FIG. 1 illustrates a cut out side view of an electronic module coupled to a fabric according to an embodiment.

FIG. 1 illustrates a cut out side view of an electronic module coupled to a fabric according to an embodiment. As used herein, the term "fabric" generally applies to cloth or other similar materials made of threads, fibers, filaments or the like, generally referred to herein as "threads". Materials used for threads can include, but are not limited to, cotton, wool, nylon, polyester or other synthetic materials. An electronic module 4 is coupled to the fabric 2. In some embodiments, the electronic module 4 is coupled to the fabric by an adhesive 6. The adhesive can be any conventional adhesive sufficient to adhere an electronics module to a fabric, such as an epoxy or glue.

In some embodiments, the electronic module 4 includes one or more electronic components 10 coupled to a printed circuit board 8. The electronic components 10 can be any conventional electronic components including, but not limited to, active electronic components such as integrated circuits, passive electronic components such as resistors, capacitors and inductors, power supplies, and other components typically connected to printed circuit boards. The printed circuit board 8 can be a single layer board or multiple layer board. The exemplary printed circuit board 8 in FIG. 1 is a multiple layer board. The printed circuit board 8 includes electrically conducting interconnects 12 that provide, in part, interconnects between electronic components 10. Interconnects can be provided on the top surface and/or the bottom surface of the printed circuit board. Additionally, interior layers in a multiple layer printed circuit board can include interconnects, such as interconnects 14, and inter-layer connections can be provided by vias, such as via 16. The interconnects can also include pads designed to provide connection points off-board.

Off-board electrical connectivity can be provided by metal foils, such as metal foil 18 and metal foil 20. In the exemplary configuration shown in FIG. 1, the metal foil 18 is coupled to the bottom layer of the printed circuit board and the metal foil 20 is coupled to an interior layer of the printed circuit board. It is understood that more or less than two metal foils can be coupled to the printed circuit board, and that metal foils can be coupled to alternative positions and/or layers on the printed circuit board then that shown in FIG. 1. In some embodiments, the metal foil is configured as a strip having a first end and a second end. As applied to FIG. 1, a first end of the metal foil 18 is coupled to a pad or other point of electrical connection on the bottom layer of the printed circuit board. A second end of the metal foil 18 extends beyond a footprint of the printed circuit board. The second end of the metal foil 18 is stitched to the fabric 2 using an electrically conductive stitched wire 24. In some embodiments, the metal foil thickness is in the millimeter range, for example between about a few millimeters to sub-millimeter. In general, the metal foil is configured with a thickness that is thin enough to enable a stitching needle to penetrate the metal foil, a width greater than a diameter of the stitching needle and a length great enough so that the second end extends beyond th footprint of the printed circuit board and provided sufficient area to stitch the second end to the fabric. The stitched wire 24 is coupled to the metal foil 18 and to the fabric 2 with sufficient force to secure the metal foil 18 to the fabric 2 and to provide an electrical connection between the metal foil 18 and the stitched wire 24.

In some embodiments, the stitched wire 24 is stitched using any conventional stitching process that uses two threads. In this case, the stitched wire 24 includes two wires, a first wire is electrically conductive and a second wire, a bobbin wire, is electrically insulated so that the two wires do not short together. In some embodiments, the first wire is made of electrically conductive material such as metal, carbon fiber, nylon wire coated with silver finish, or metal particles embedded polymer wire. Examples of metal wire include, but are not limited to, copper, silver, steel or their alloys. The metal wire can also be coated with different finishes such as gold flash over nickel, silver or solder. In some embodiments, the second wire is made of electrically insulated material such as nylon or polyester. It is understood that alternative electrically conductive materials can be used for the first wire and alternative electrically insulated materials can be used for the second wire. For simplicity, the stitched wire is generally referred to herein as being electrically conductive, even in those configurations where a second insulated wire is used in the stitching process.

FIG. 1 shows the adhesive 6 positioned between the metal foil 18 and the fabric 2. Alternatively, the metal foil 18 can extend beyond the edge of the adhesive 6 so that the metal foil 18 is secured directly to the fabric 2. This can be achieved by either extending the metal foil 18 further then that shown in FIG. 1 or by reducing the area covered by the adhesive 6. In some embodiments, the adhesive is applied such that none of the stitched wire passes through adhesive.

Similar to the metal foil 18, a first end of the metal foil 20 is coupled to a pad or other point of electrical connection on an interior layer of the printed circuit board. A second end of the metal foil 20 extends beyond a footprint of the printed circuit board. The second end of the metal foil 20 is stitched to the fabric 2 using stitched wire 22.

It is understood that other configurations of the metal foil are contemplated, where a first portion of the metal foil is electrically coupled to a pad or other point of electrical connection on the printed circuit board and a second portion extends beyond a footprint of the printed circuit board and is stitched to the fabric using electrically conductive wire.

Figure 2:
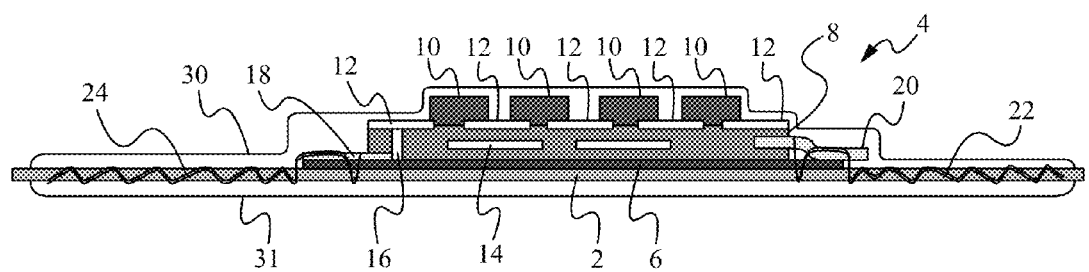
FIG. 2 illustrates the electronic module of FIG. 1 including an encapsulation layer.

In some embodiments, an encapsulation layer is added over the electronic module 4 and the stitched wires 22 and 24, such as an encapsulation layer 30 shown in FIG. 2. A backside encapsulation layer is also added over the stitched wires 22 and 24 on the backside of the fabric 2, such as backside encapsulation layer 31. In some embodiments, the encapsulation layer is an elastic material, such as an elastic polymer, or elastomer, which is a polymer with viscoelasticity. It is understood that alternative elastic substrates can be used including, but not limited to, silicone, urethane, latex and spandex, also referred to as elastane. The encapsulation layer provides environmental protection as well as electrical isolation of individual electrical connection points and wires.

Figure 3:
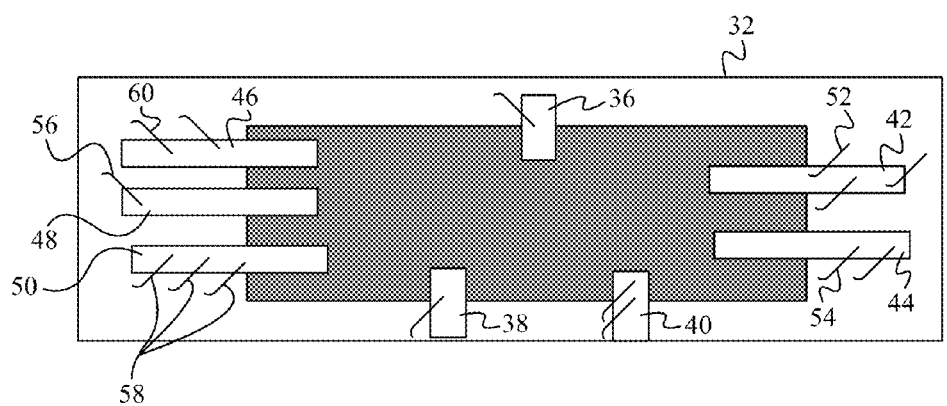
FIG. 3 illustrates a top down view of another exemplary electronic module coupled to a fabric.

The number and positions of the metal foils extending from the printed circuit board varies by application. One or more metal foils can extend laterally from the printed circuit board in any direction. One or more metal foils can be coupled to the printed circuit board on any layer, top, bottom or interior. One or more stitches can be used to stitch electrically conductive wire to any given metal foil. FIG. 3 illustrates a top down view of another exemplary electronic module 34 coupled to a fabric 32. For simplicity, the details of the electronic module 34 are not shown. Various metal foils 36-50 are coupled to a top layer of the electronic module 34 and extend beyond a footprint of the electronic module 34. Although each of the metal foils is shown extending in a perpendicular direction relative to an outer edge of the electronic module 34, it is understood that a metal foil can extend in a non-perpendicular direction. Each of the metal foils is also shown to be linear. It is understood that the metal foils can be non-liner in shape and direction extending from the electronic module. The number and placement of electrically conductive wire stitches per metal foil can vary. For example, metal foil 42 has three electrically conductive wire stitches 52 arranged in a non-linear configuration, whereas metal foil 50 has three electrically conductive wire stitches 58 arranged in a linear configuration. Metal foils 44 and 46 each have two electrically conductive wire stitches 54 and 60, respectively, that are arranged linearly, and metal foil 48 has a single electrically conductive wire stitch 56.

In some embodiments, the electrically conductive wire is stitched to the metal foil by piercing the metal foil such that the electrically conductive wire passes through the metal foil, as shown in the above embodiments. In other embodiments, the electrically conductive wire is looped over the metal foil and pulled toward the fabric, such as by lashing the metal foil to the fabric using the electrically conductive wire.

In some embodiments, the fabric includes one or more insulated wires intermixed with the fabric threads. An example of a fabric having intermixed insulated wires is found in the co-pending U.S. patent application Ser. No. 14/194,497, titled "Magnet Wire for Wearable Electronics Fabric", which is hereby incorporated in its entirety by reference. In some embodiments, the insulated wire includes an inner metal wire and an outer insulation layer. In some embodiments, the electrically conductive wire stitched to the metal foil is also electrically coupled to the metal wire within the insulated wire of the fabric.

As used herein, the term "intermix" generally refers to mixing or blending together and is applied herein to describe the manner by which an insulated wire, such as a magnet wire, is integrated as part of a fabric. The magnet wire is intermixed with the fabric using conventional methodologies, for example weaving, stitching, felting or knitting, and is intended to include, but not be limited to, such similar concepts as intertwining, interweaving, interspersing, interlacing, intermingling and the like of the magnet wire and fabric threads.

Magnet wire is typically made of a copper or aluminum wire coated with a very thin layer of insulation. Magnet wire is referred to as "magnet" due to its electromagnetic applications. Magnet wires can be used in the construction of transformers, inductors, motors, speakers, hard disk head actuators, potentiometers, electromagnets, and other applications which require tight coils of wire. The metal wire itself is most often fully annealed, electrolytically refined copper. Smaller diameter magnet wire usually has a round cross section. An example of this kind of wire is used for things such as electric guitar pickups. Thicker magnet wire is often square or rectangular with rounded corners to provide more current flow per coil length.

In some embodiments, magnet wire includes one to four layers of polymer film insulation, often of two different compositions, to provide a tough, continuous insulating layer. Materials used for magnet wire insulating films can include, but are not limited to, polyvinyl formal (Formvar™), polyurethane, polyimide, polyester, polyester-polyimide, polyamide-polyimide (or amide-imide), and polyimide. Polyimide insulated magnet wire is capable of operation at up to 250° C. In other embodiments, different types of insulation are used including, but not limited to, fiberglass yarn with varnish, aramid paper, kraft paper, mica, and polyester film. It is understood that are types of magnet wires can be used, for example a silver wire having various insulators, such as polytetrafluoroethylene (Teflon™), such as that found in the audio industry. For ease of manufacturing, newer magnet wires can have insulation that acts as a flux when burnt during soldering. This results in magnet wires having electrical connections at the ends that can be made without stripping off the insulation first. Older magnet wires do not have this type of insulation and can require sandpapering or scraping to remove the insulation before soldering.

There are various methodologies for forming the electronics module with metal foils and stitching the metal foils to the fabric. In some embodiments, the metal foils are formed separately and attached to the electronic module. For example, a metal foil strip is formed and the first end of the metal foil strip is attached, such as by soldering, to an electrical connection point, such as a pad, on the printed circuit board. The second end of the metal foil strip is stitched to the fabric using the stitched electrically conductive wire. In some embodiments, the metal foil is made of copper. It is understood that the metal foil can be made of other electrically conductive material.

Figure 4:
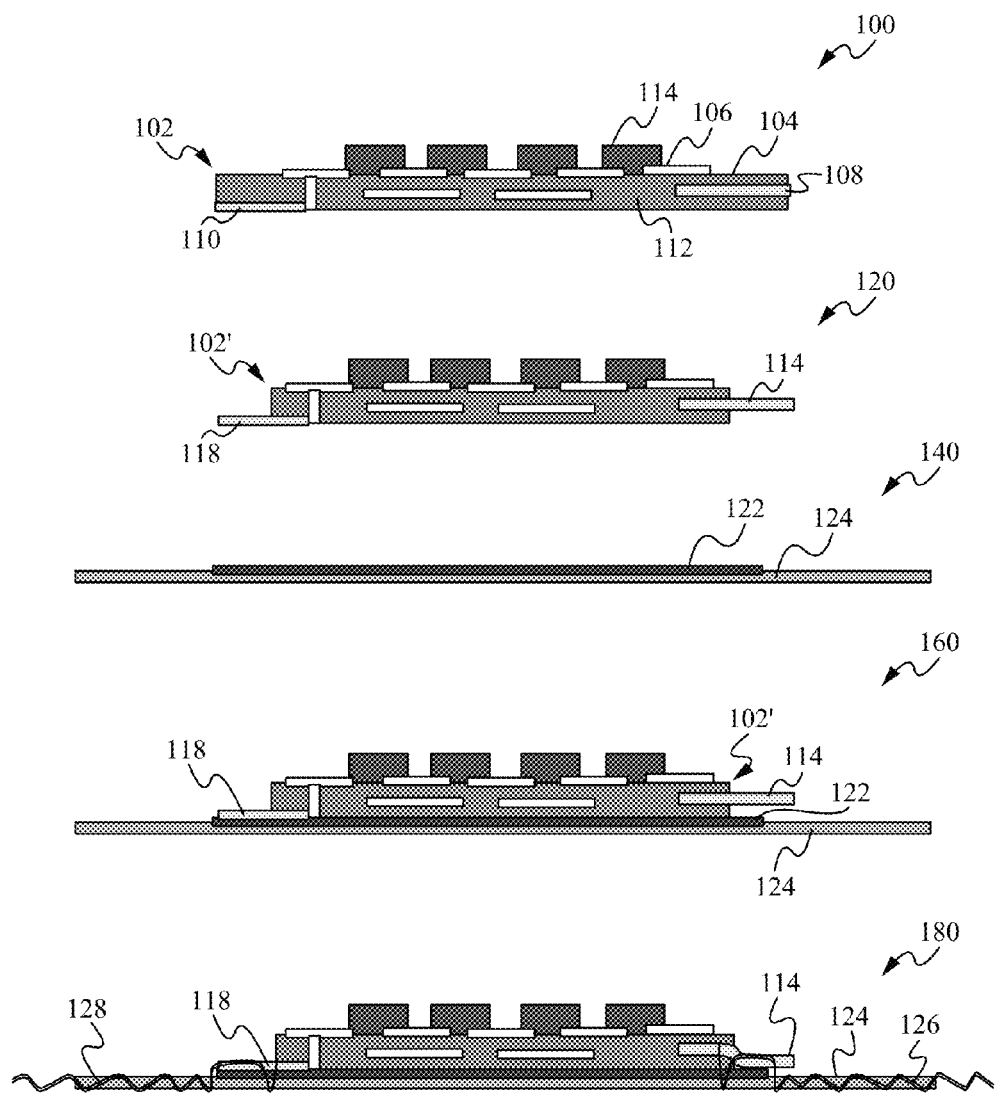
FIG. 4 illustrates a method of fabricating an electronic module having metal foils and coupling the electronic module to a fabric according to an embodiment.

In other embodiments, the metal foils can be formed from the printed circuit board itself. FIG. 4 illustrates a method of fabricating an electronic module having metal foils and coupling the electronic module to a fabric according to an embodiment. At the step 100, an electronic module is fabricated. The electronic module 104 includes one or more components 114 coupled to a PCB 104. In the exemplary embodiment shown in FIG. 4, the PCB 104 is a multiple layer PCB having interconnects for electronic conductivity between the components 114, such as interconnects 106, and for providing off-board electrical conductivity, such as via pads. Interconnects can be formed on one of more layers of the multiple layer PCB with inter-layer connection provided by vias. For example, the PCB 104 includes top layer interconnects 106, interior layer interconnects 108 and bottom layer interconnects 110. In some embodiments, the electronic module 102 is fabricated using conventional PCB fabrication and SMT (surface mount technology) processes. Each layer of the PCB is made using conventional substrate material, such as laminate 112. The PCB 104 is designed and fabricated having certain interconnects that will be subsequently used as metal foils, such as interconnect 108 and interconnect 110. Any number of interconnections on any layer of the PCB can be deigned and fabricated for use as a metal foil.

At the step 120, selective portions of the laminate material 112 are removed from the electronics module 102 in step 100 to expose the interconnects designed for use as metal foils. For example, a portion of the interconnect 108 is exposed to form an exposed end of a metal foil 114. Similarly, a portion of the interconnect 110 is exposed to form an exposed end of a metal foil 118. In some embodiments, the laminate material 112 is ablated using a laser of drill. It is understood that other conventional methods can be used to selectively remove PCB substrate material to expose the interconnect. In order for the metal foils to be subsequently stitched to a fabric, the metal foils must extend beyond a footprint of the PCB. In the case where the metal foil is formed from an interconnect of the PCB, the footprint is defined as the PCB perimeter after the PCB substrate removal process is performed. The interconnects that are exposed to form the metal foils are formed, in part, at an edge of the PCB such that removal of the PCB substrate at the edge area surrounding the interconnect results in the exposed interconnect extending beyond the footprint of the final product PCB.

Steps 100 and 120 are shown as mounting the components 114 prior to removing the PCB substrate material. It is understood that the components 114 can be mounted after the PCB substrate material is removed.

At the step 140, an adhesive is applied to a fabric 124 where the electronic module is to be attached. At the step 160, the electronic module 102' from the step 120 is attached to the fabric 124 via the adhesive 122. In some embodiments, a curing step is performed to secure the electronic module 102' to the adhesive 122.

At the step 180, the metal foil 114 is stitched to the fabric 124 using stitched electrically conductive wire 126 and the metal foil 118 is stitched to the fabric 124 using stitched electrically conductive wire 126. For those metal foils formed from interconnects not included in the bottom layer of the PCB 104, such as the metal foil 114, the force of the stitched electrically conductive wire bends the metal foil onto the fabric, or adhesive. An optional additional step can be performed where the stitched electrically conductive wire 126 is electrically coupled to an insulated wire (not shown) intermixed in the fabric 124, and the stitched electrically conductive wire 128 is electrically coupled to another insulated wire (not shown) intermixed in the fabric 124. Another optional additional step can be performed where an encapsulation layer, such as the encapsulation layers 30 and 31 in FIG. 2, is added over the electronic module 102' and the stitched electrically conductive wires 122 and 124.

The exemplary configurations described above are directed to a single electronic module coupled to the fabric. It is understood that alternative configurations are configured that include more than one electronic module coupled to the fabric. In such embodiments, the stitched electrically conductive wire can be used to connect multiple electronic modules, or to intervening insulated wires woven into the fabric, which in turn may be electrically coupled to other electronic modules via stitched electrically conductive wires.

Although embodiments of the electronics assembly are described above as wearable electronics assembly, the general concepts described herein can be applied generally to electronics coupled to fabrics, wearable or otherwise.

The present application has been described in terms of specific embodiments incorporating details to facilitate the understanding of the principles of construction and operation of the products and methods. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. An electronics assembly comprising:
    a fabric;
    an electronics module coupled to the fabric, wherein the electronics module includes an electrical connection point;
    a metal foil comprising a first portion and a second portion, wherein the first portion is coupled to the electrical connection point and the second portion extends beyond a physical footprint of the electronics module; and
    an electrically conductive wire stitched to the fabric and to the second portion of the metal foil such that an electrical connection is formed between the electrically conductive wire and the electrical connection point via the metal foil.

2. The electronics assembly of claim 1 wherein the electrically conductive wire is stitched through the second portion of the metal foil and through the fabric.

3. The electronics assembly of claim 1 wherein the electrically conductive wire is stitched through the fabric and over the second portion of the metal foil thereby lashing the second portion of the metal foil to the fabric.

4. The electronics assembly of claim 1 wherein the metal foil comprises a strip having a first end and a second end, wherein the first portion comprises the first end and the second portion comprises the second end.

5. The electronics assembly of claim 1 further comprising an encapsulation layer coupled to the electronics module, the metal foil and the electrically conductive wire.

6. The electronics assembly of claim 1 wherein the electronics module comprises a printed circuit board and one or more electronic components coupled to the printed circuit board, further wherein the printed circuit board comprises the electrical connection point.

7. The electronics assembly of claim 6 wherein the printed circuit board further comprises one or more electrically conductive interconnects.

8. The electronics assembly of claim 7 wherein the metal foil comprises one of the one or more interconnects such that the first portion of the metal foil is integrated with a substrate of the printed circuit board and the second portion of the metal foil is free of the substrate.

9. The electronics assembly of claim 6 wherein the printed circuit board comprises a single layer printed circuit board.

10. The electronics assembly of claim 6 wherein the printed circuit board comprises a multiple layer printed circuit board.

11. The electronics assembly of claim 10 wherein the metal foil is coupled to a top layer, a bottom layer, or an interior layer of the printed circuit board.

12. The electronics assembly of claim 1 wherein the fabric comprises an insulated wire including an inner metal wire and an outer insulation layer, further wherein the electrically conductive wire is electrically coupled to the inner metal wire of the insulated wire.

13. The electronics assembly of claim 1 wherein the electrically conductive wire stitched to the fabric comprises two separate wires, wherein the two separate wires comprise a metal wire and an insulation wire.

14. The electronics assembly of claim 1 wherein the electronics assembly is wearable.

15. The electronics assembly of claim 1 wherein the electrically conductive wire is stitched to the fabric such that the electrically conductive wire does not extend within the footprint of the electronics module.

* * * * *